United States Patent
He et al.

(10) Patent No.: US 12,182,351 B2
(45) Date of Patent: Dec. 31, 2024

(54) ELECTRONIC DEVICE HAVING PRESSURE SENSING ASSEMBLY

(71) Applicant: VIVO MOBILE COMMUNICATION CO., LTD., Dongguan (CN)

(72) Inventors: Yifan He, Dongguan (CN); Kaiwei Zhang, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 0 days.

(21) Appl. No.: 18/219,636

(22) Filed: Jul. 7, 2023

(65) Prior Publication Data
US 2023/0350510 A1    Nov. 2, 2023

Related U.S. Application Data

(63) Continuation of application No. PCT/CN2022/070111, filed on Jan. 4, 2022.

(30) Foreign Application Priority Data

Jan. 8, 2021 (CN) .......................... 202110023815.1

(51) Int. Cl.
G06F 3/041 (2006.01)
(52) U.S. Cl.
CPC .................. *G06F 3/0414* (2013.01)
(58) Field of Classification Search
CPC .... G06F 3/0414; G06F 1/1626; G06F 1/1684; G06F 3/045; H03K 2217/9651; H03K 17/965; G01L 1/2262
See application file for complete search history.

(56) References Cited

U.S. PATENT DOCUMENTS

| | | | |
|---|---|---|---|
| 2010/0103135 A1* | 4/2010 | Sugahara | G06F 1/1684 345/173 |
| 2016/0147353 A1 | 5/2016 | Filiz et al. | |

(Continued)

FOREIGN PATENT DOCUMENTS

| | | |
|---|---|---|
| CN | 105094449 A | 11/2015 |
| CN | 105224129 A | 1/2016 |

(Continued)

OTHER PUBLICATIONS

International Search Report issued in corresponding International Application No. PCT/CN2022/070111, mailed Mar. 22, 2022, 5 pages.

(Continued)

Primary Examiner — Temesghen Ghebretinsae
Assistant Examiner — Ivelisse Martinez Quiles
(74) Attorney, Agent, or Firm — IPX PLLC

(57) ABSTRACT

An electronic device is provided. The electronic device includes a housing, a display screen and a pressure sensing assembly. The display screen is arranged on the housing and enclosed with the housing to form an accommodating cavity. The display screen has a target region. The pressure sensing assembly is arranged in the display screen and corresponds to the target region. The pressure sensing assembly includes a first deformation member, a second deformation member, and a supporting member. The first deformation member, the supporting member, and the second deformation member are stacked in sequence in a direction perpendicular to the display screen. When the target region is not subjected to a force, the first deformation member is in a first shape, and the second deformation member is in a second shape. When the target region is subjected to a force, the pressure sensing assembly deforms and outputs a pressure signal.

5 Claims, 5 Drawing Sheets

(56) References Cited

U.S. PATENT DOCUMENTS

| | | | |
|---|---|---|---|
| 2018/0046305 A1* | 2/2018 | Kang | ................. H04M 1/0266 |
| 2018/0210601 A1 | 7/2018 | Chi et al. | |
| 2019/0311172 A1* | 10/2019 | Kang | ..................... G06F 3/016 |
| 2019/0317634 A1 | 10/2019 | Lee | |
| 2019/0368952 A1* | 12/2019 | Li | .......................... G06F 3/016 |
| 2022/0326101 A1* | 10/2022 | Li | .......................... G06F 3/041 |

FOREIGN PATENT DOCUMENTS

| | | | |
|---|---|---|---|
| CN | 106020559 A | 10/2016 | |
| CN | 205845026 U | 12/2016 | |
| CN | 106708305 A | 5/2017 | |
| CN | 207764779 U | 8/2018 | |
| CN | 208156557 U | 11/2018 | |
| CN | 208369554 U | 1/2019 | |
| CN | 109917943 A | 6/2019 | |
| CN | 110297559 A | 10/2019 | |
| CN | 210155578 U | 3/2020 | |
| CN | 111725283 A | 9/2020 | |
| CN | 112163463 A | 1/2021 | |
| CN | 112764575 A | 5/2021 | |
| CN | 113346889 A | 9/2021 | |

OTHER PUBLICATIONS

Extended European Search Report issued in related European Application No. 22736507.9, mailed Jun. 6, 2024, 9 pages.

* cited by examiner

ELECTRONIC DEVICE HAVING PRESSURE SENSING ASSEMBLY

CROSS-REFERENCE TO RELATED APPLICATIONS

The present application is a continuation of International Application No. PCT/CN2022/070111, filed on Jan. 4, 2022, which claims priority to the Chinese Patent Application No. 202110023815.1, and filed on Jan. 8, 2021, The entire contents of each of the above-referenced applications are expressly incorporated herein by reference.

TECHNICAL FIELD

This application relates to the field of electronic device, and in particular, to an electronic device.

BACKGROUND

With the continuous development of terminal devices, advantages of pressure-sensing buttons have become increasingly prominent because the pressure-sensing buttons do not need physical buttons. In some embodiments, the pressure-sensing buttons are mostly used for side pressure to implement corresponding functions, so as to satisfy human-computer interaction requirements.

However, a side edge is small in area, and a control mode that may be realized by side-sensing buttons is limited, which can no longer satisfy various interactive requirements of a user and affect user experience.

SUMMARY

Embodiments of this application provide an electronic device.

This application is implemented as follows:

According to a first aspect, an electronic device is provided, including:

a housing;

a display screen, wherein the display screen is arranged on the housing and enclosed with the housing to form an accommodating cavity, and the display screen has a target region;

a pressure sensing assembly, wherein the pressure sensing assembly is arranged in the display screen and located in the accommodating cavity, the pressure sensing assembly corresponds to the target region, the pressure sensing assembly comprises a first deformation member, a second deformation member, and a supporting member, the first deformation member, the supporting member, and the second deformation member are stacked in sequence in a direction perpendicular to the display screen;

in a case that the target region is not subjected to a force, the first deformation member is in a first shape, and the second deformation member is in a second shape; and in a case that the target region is subjected to a force, the pressure sensing assembly deforms and outputs a pressure signal.

In the embodiments of this application, an electronic device is provided, including a housing; a display screen, where the display screen is arranged on the housing and enclosed with the housing to form an accommodating cavity, and the display screen has a target region; a pressure sensing assembly, where the pressure sensing assembly is arranged in the display screen and located in the accommodating cavity, the pressure sensing assembly corresponds to the target region, the pressure sensing assembly includes a first deformation member; a second deformation member, and a supporting member, and the first deformation member, the supporting member, and the second deformation member are stacked in sequence in a direction perpendicular to the display screen; in a case that the target region is not subjected to a force, the first deformation member is in a first shape, and the second deformation member is in a second shape; and in a case that the target region is subjected to a force, the pressure sensing assembly deforms and outputs a pressure signal. In the embodiments of the application, the pressure sensing assembly is combined with the display screen. When the target region on the display screen corresponding to the pressure sensing assembly is subjected to a force, the display screen may transmit the force to the pressure sensing assembly, the pressure sensing assembly deforms and may output the pressure signal. Because of a larger area of the display screen, more control modes may be realized, thereby providing more abundant human-computer interaction requirements for users and improving user experience.

BRIEF DESCRIPTION OF THE DRAWINGS

The accompanying drawings described herein are used for providing a further understanding of this application, and form part of this application. Exemplary embodiments of this application and descriptions thereof are used for explaining this application, and do not constitute any inappropriate limitation to this application. In the accompanying drawings.

DETAILED DESCRIPTION

The following clearly describes the technical solutions in the embodiments of this application with reference to the accompanying drawings in the embodiments of this application. Apparently, the described embodiments are some of the embodiments of this application rather than all of the embodiments. All other embodiments obtained by a person of ordinary skill in the art based on the embodiments of this application without creative efforts shall fall within the protection scope of this application.

The specification and claims of this application, and terms "first" and "second" are used to distinguish similar objects, but are unnecessarily used to describe a specific sequence or order. It should be understood that the data in such a way are interchangeable in proper circumstances, so that the embodiments of this application can be implemented in other orders than the order illustrated or described herein. In addition, in the specification and the claims, "and/or" represents at least one of the connected objects, and the character "1" generally represents an "or" relationship between the associated objects.

An electronic device provided in the embodiments of this application is described below through embodiments and application scenarios thereof with reference to the accompanying drawings.

Figure 1:
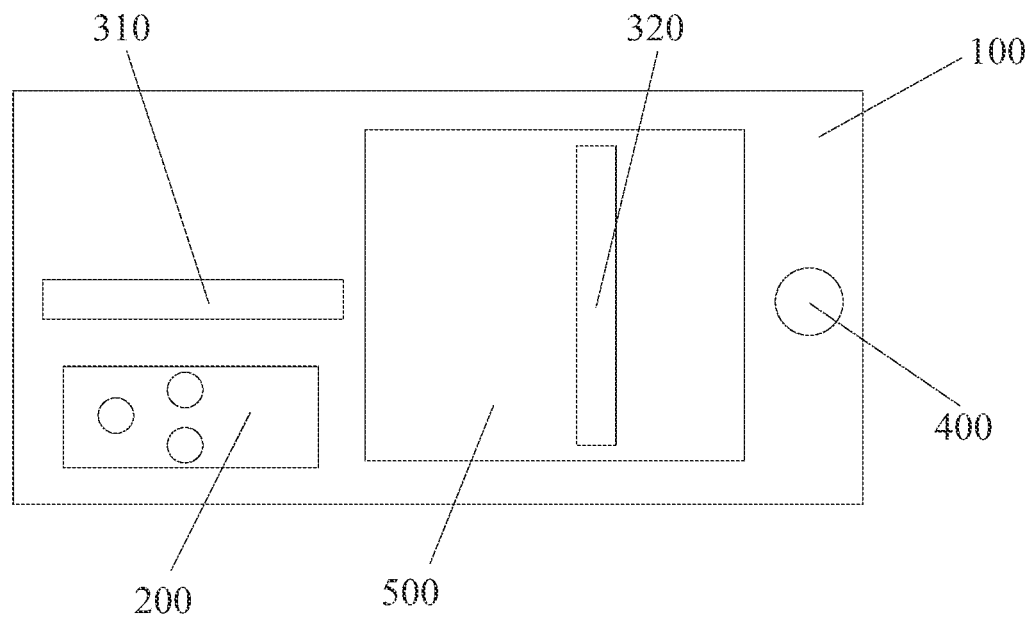
FIG. 1 is a schematic structural diagram of an electronic device according to an embodiment of this application.
Figure 2:
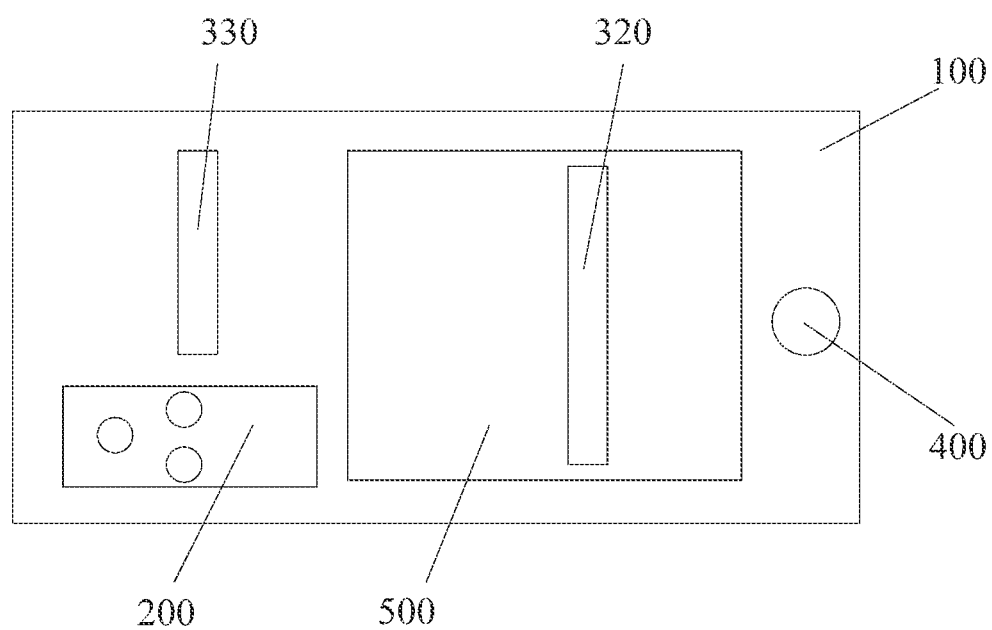
FIG. 2 is a schematic structural diagram of another electronic device according to an embodiment of this application.
Figure 3:
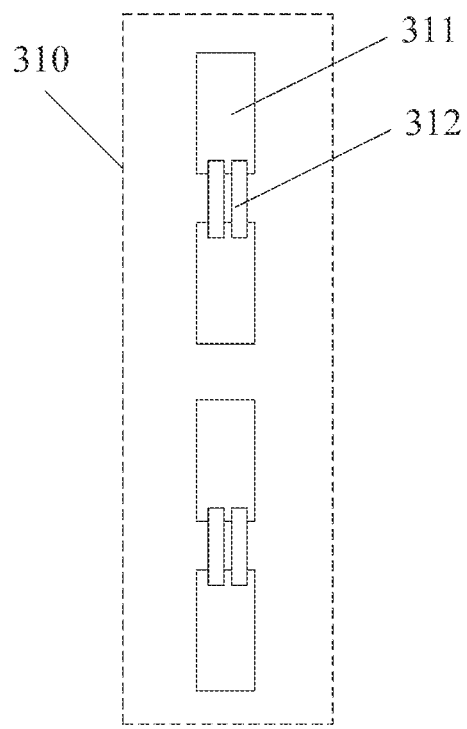
FIG. 3 is a schematic structural diagram of a pressure sensing assembly according to an embodiment of this application.
Figure 4:
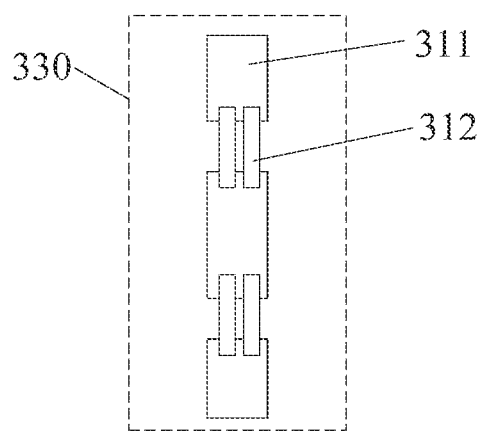
FIG. 4 is a schematic structural diagram of another pressure sensing assembly according to an embodiment of this application.
Figure 5:
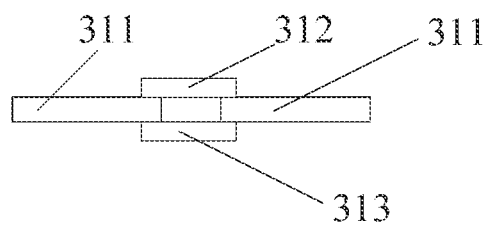
FIG. 5 is a schematic structural diagram of a pressure sensing assembly according to an embodiment of this application.
Figure 6:
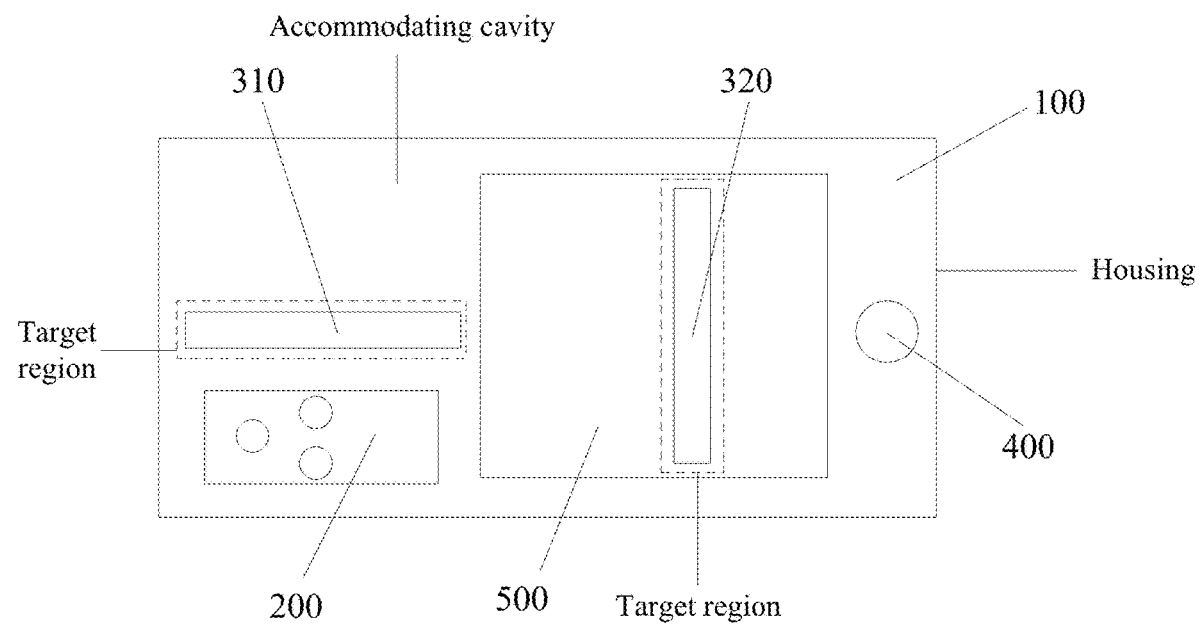
FIG. 6 is a schematic structural diagram of an electronic device according to an embodiment of this application.
Figure 7:
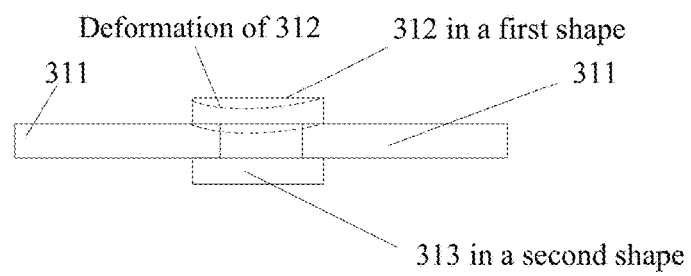
FIG. 7 is a schematic structural diagram of a pressure sensing assembly according to an embodiment of this application.
Figure 8:
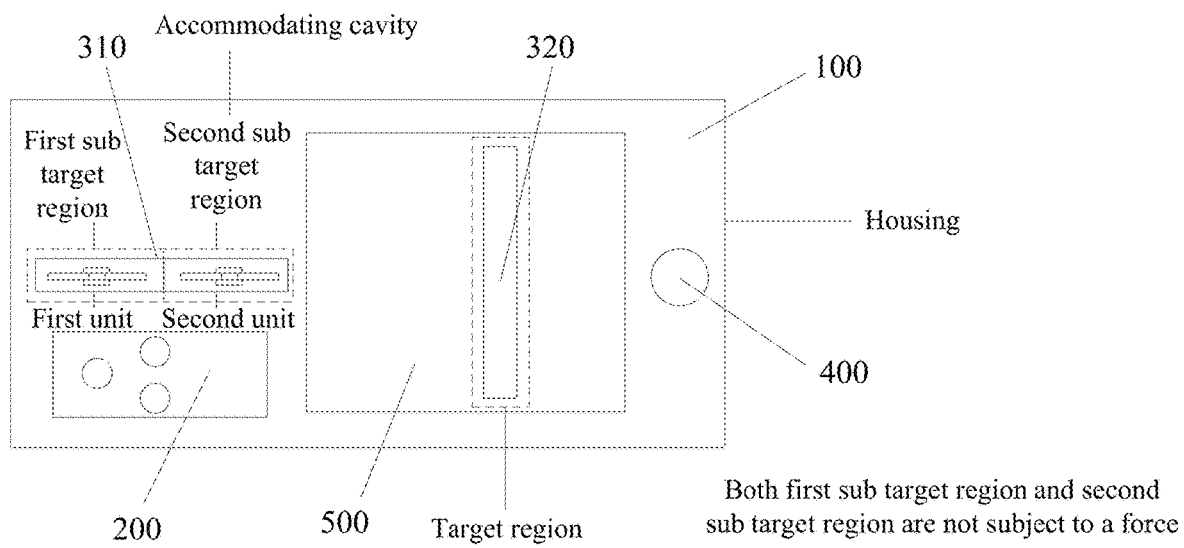
FIG. 8 is a schematic structural diagram of a pressure sensing assembly when both a first sub target region and a second sub target region are not subject to a force according to an embodiment of this application.
Figure 9:
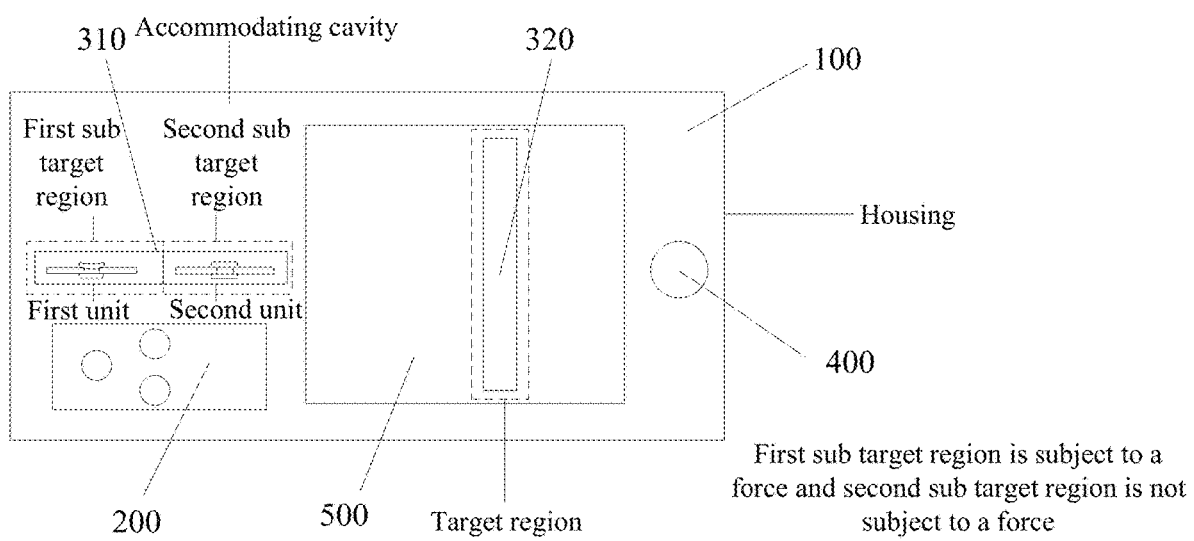
FIG. 9 is a schematic structural diagram of a pressure sensing assembly when a first sub target region is subject to a force and a second sub target region is not subject to a force according to an embodiment of this application.
Figure 10:
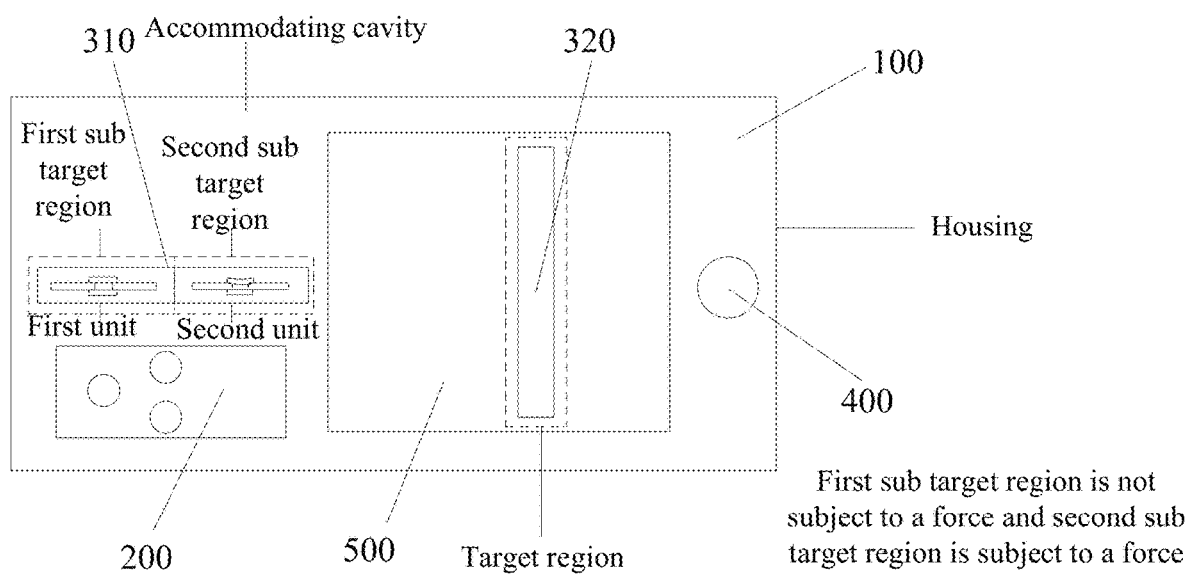
FIG. 10 is a schematic structural diagram of a pressure sensing assembly when a first sub target region is not subject to a force and a second sub target region is subject to a force according to an embodiment of this application.

As shown in FIG. 1 to FIG. 5, the electronic device may include: a housing, a display screen 100, and a pressure sensing assembly.

In some embodiments, the display screen 100 is arranged on the housing and enclosed with the housing to form an accommodating cavity, and the display screen 100 has a target region; the pressure sensing assembly is arranged in the display screen 100 and located in the accommodating cavity, the pressure sensing assembly corresponds to the target region, the pressure sensing assembly includes a first deformation member 312, a second deformation member 313, and a supporting member 311, the first deformation member 312, the supporting member 311, and the second deformation member 313 are stacked in sequence in a direction perpendicular to the display screen 100; in a case that the target region is not subjected to a force, the first deformation member 312 is in a first shape, and the second deformation member 313 is in a second shape; and in a case that the target region is subjected to a force, the pressure sensing assembly deforms and outputs a pressure signal.

The first deformation member 312 and the second deformation member 313 may be a resistor, or may be a capacitor, a piezoelectric ceramic, or the like. The target region is a region where the pressure sensing assembly can be deformed when subjected to pressure.

It should be noted that the display screen 100 is generally rectangular or nearly rectangular in shape. The direction perpendicular to the display screen 100 is generally considered to be a direction of a thickness of the display screen 100, a direction of a longer side of the rectangle is a length direction of the display screen 100, and a direction of a shorter side of the rectangle is a width direction of the display screen 100.

In the embodiments of this application, the electronic device includes a housing; a display screen 100, where the display screen 100 is arranged on the housing and enclosed with the housing to form an accommodating cavity, and the display screen 100 has a target region; a pressure sensing assembly, where the pressure sensing assembly is arranged in the display screen 100 and located in the accommodating cavity, the pressure sensing assembly corresponds to the target region, the pressure sensing assembly includes a first deformation member 312, a second deformation member 313, and a supporting member 311, the first deformation member 312, the supporting member 311, and the second deformation member 313 are stacked in sequence in a direction perpendicular to the display screen 100; in a case that the target region is not subjected to a force, the first deformation member 312 is in a first shape, and the second deformation member 313 is in a second shape; and in a case that the target region is subjected to a force, the pressure sensing assembly deforms and outputs a pressure signal. In the embodiments of this application, the pressure sensing assembly is combined with the display screen 100, when the target region on the display screen 100 corresponding to the pressure sensing assembly is subjected to a force, the display screen 100 may transmit the force to the pressure sensing assembly, the pressure sensing assembly generates deformation and may output the pressure signal. Because of a larger area of the display screen 100, more control modes may be realized, thereby providing more abundant human-computer interaction requirements for users. In addition, because of a larger deformation of the display screen 100, sensitivity and accuracy of a pressure sensing detection may be further improved, to improve user experience.

It should be noted that the electronic device may further include a control module. When the target region is subjected to a force, a screen transmits the force to the pressure sensing assembly, and the pressure sensing assembly deforms. In addition, the pressure signal is outputted to the control module connected to the pressure sensing assembly, and the control module generates a corresponding control signal based on the pressure signal, to control the electronic device.

The pressure sensing assembly may be arranged on a Flexible Printed Circuit (FPC), the control module is arranged on the circuit board, and the FPC is electrically connected to the circuit board. The connection structure is not described in detail in this application, but can be determined according to actual situations.

In a possible implementation in this application, the electronic device may include: a functional module 200.

The functional module 200 may be located on an upper half screen of the display screen 100, and may be a camera module, a flash module, an auxiliary display screen module, and the like. In the embodiments of this application, the display screen 100 may be divided into an upper half screen and a lower half screen in a length direction.

To avoid the camera module, a design of sinking the functional module 200 may be adopted. However, with the development of the electronic device, especially a mobile electronic device, endurance capacity of the whole device has become one of the functional characteristics that the user pays more attention to. In a case that the pressure sensing assembly is not used, the battery 500 may be made larger and thinner, so that the whole device becomes thinner to a certain extent.

However, if the pressure sensing assembly and a large volume battery 500 are to be taken into account at the same time, the pressure sensing assembly needs to be embedded in a middle frame of the electronic device. In this case, an FPC provided with the pressure sensing assembly needs to be connected to a circuit board provided with the control module, to perform data communication.

As described above, when the pressure sensing assembly is arranged on the display screen 100, because of the large volume of the battery 500, a position where the circuit board connects to the battery 500 is generally arranged between the circuit board and the battery 500, and a plurality of peripheral interfaces on the circuit board are distributed in a staggered manner in corresponding regions. If the pressure sensing assembly is sunk, a wiring between the interface and the FPC may not be staggered, which increases difficulty of a circuit design.

Therefore, in the direction perpendicular to the display screen 100, the projection of the functional module 200 is located outside the pressure sensing assembly. That is, the functional module 200 and the pressure sensing assembly are distributed in a staggered manner, and when the pressure sensing assembly is designed, the functional module 200 is avoided. This avoids wiring problems.

To increase a sensing range of the pressure sensing assembly, the pressure sensing assembly may include a plurality of pressure sensing modules, and the plurality of pressure sensing modules may be distributed at a plurality of positions of the display screen 100 at intervals, so that the sensing range covers an entire screen as much as possible, thereby increasing user experience.

In a possible implementation in this application, the pressure sensing assembly may include a first pressure sensing module 310 and a second pressure sensing module 320.

In some embodiments, at least a part of the first pressure sensing module 310 and the functional module 200 are distributed in a width direction of the display screen 100; and the second pressure sensing module 320 and the first pressure sensing module 310 are distributed in a length direction of the display screen 100.

As described above, the functional module 200 is generally arranged on the upper half screen of the display screen 100, that is, the first pressure sensing module 310 is arranged on the upper half screen of the display screen 100, and the second pressure sensing module 320 is arranged on the lower half screen of the display screen 100. Through two pressure sensing modules, a wide range of sensing range may be implemented, which can not only reduce costs, but also reduce a quantity of electronic components in the electronic device.

The first pressure sensing module 310 may include a plurality of units spaced apart, each unit includes a first deformation member 312, a second deformation member 313, and a supporting member 311. The first deformation member 312, the supporting member 311, and the second deformation member 313 are stacked in sequence in the direction perpendicular to the display screen 100.

In a possible embodiment of this application, a first pressure sensing module 310 includes a first unit and a second unit that are spaced apart, the first unit and the second unit each include a first deformation member 312, a second deformation member 313, and a supporting member 311. The first deformation member 312, the supporting member 311, and the second deformation member 313 are stacked in sequence in a direction perpendicular to a display screen 100, and the first unit and the second unit are distributed in a length direction of the display screen 100.

That is, the first pressure sensing module 310 has a strip-shaped structure and is arranged in the length direction of the display screen 100, so that a functional module 200 may be better avoided.

In a possible implementation of this application, a target region may include a first sub-target region and a second sub-target region. Correspondingly, a pressure signal may include a first sub-pressure signal and a second sub-pressure signal, where the first sub-target region corresponds to a first unit and the second sub-target region corresponds to a second unit.

In a case that both the first sub-target region and the second sub-target region are not subjected to a force, a first deformation member 312 is in a first shape, and a second deformation member 313 is in a second shape; in a case that the first sub-target region is subjected to a force and the second sub-target region is not subjected to a force, the first unit deforms and outputs the first sub-pressure signal; and in a case that the second sub-target region is subjected to a force and the first sub-target region is not subjected to a force, the second unit deforms and outputs the second sub-pressure signal.

Further, since both the first unit and the second unit are arranged on the display screen 100, when the first sub-target region is subjected to a force, a deformation occurs on a screen, so that the second unit is also subjected to a force. Therefore, when the first sub-target region is subjected to the force, the first deformation member 312 of the first unit changes from the first shape to the third shape, the second deformation member 313 of the first unit changes from the second shape to a fourth shape, the first deformation member 312 of the second unit changes from the first shape to a fifth shape, and the second deformation member 313 of the second unit changes from the second shape to a sixth shape. The first sub-pressure signal finally outputted is a pressure signal generated by combining pressure signals generated by the first unit and the second unit.

If the force is small, the first deformation member 312 of the first unit changes from the first shape to the third shape, the second deformation member 313 of the first unit changes from the second shape to the fourth shape, and shapes of the first deformation member 312 and the second deformation member 313 of the second unit may keep unchanged. In this case, an outputted first sub-pressure signal is a pressure signal outputted by the first unit.

The deformation of the deformation member of the first unit is larger than that of the deformation member of the second unit.

Correspondingly, the force on the second sub-target region is similar to that on the first sub-target region, and details are not repeated herein for the brevity of the text.

The deformation of the deformation member of the second unit is larger than that of the deformation member of the first unit.

According to the deformation of the deformation members, the control module may determine a pressure signal outputted by the first pressure sensing module 310, and then control the electronic device through the pressure signal. When different positions of the display screen 100 are subjected to the force or a magnitude of the force is different, the pressure signals outputted by the first pressure sensing module 310 determined by the control module are different, so that various human-computer interaction modes may be implemented to satisfy user requirements.

In a case that the functional module 200 is located at a corner of the electronic device, to make the sensing range sensed by the first pressure sensing module 310 larger, the first pressure sensing module 310 may be arranged at a same distance from two long sides of the display screen 100.

In a possible implementation of this application, a first pressure sensing assembly 330 may include a third unit and a fourth unit that are connected to each other, the third unit and the fourth unit each include a first deformation member 312, a second deformation member 313, and a supporting member 311. The first deformation member 312, the supporting member 311, and the second deformation member 313 are stacked in sequence in a direction perpendicular to a display screen 100, and the third unit and the fourth unit are distributed in a width direction of the display screen 100.

That is, the first pressure sensing module 310 may be arranged not only in the length direction of the display screen 100, but also in the width direction of the display screen 100. However, to avoid the functional module 200, a distance between two unit deformation members may be reduced as much as possible, to reduce a size of the first pressure sensing module 310.

The distance between the two unit deformation members may be reduced in a manner of reducing a size of the supporting member 311, or in a manner of reducing the supporting member 311 between the two unit deformation members.

In a possible implementation of this application, a target region may include a third sub-target region, and a pressure signal may include a third sub-pressure signal. The third unit and the fourth unit connected to each other may be regarded as a whole because of a close distance, that is, the whole corresponds to the third sub-target region.

The sub-target region mentioned above all refer to the sensing range of corresponding units, and a size of each sub-target region may be the same or may be different, which may be determined according to conditions.

In a case that the third sub-target region is not subjected to the force, the first deformation member 312 is in the first shape, and the second deformation member 313 is in the second shape; and in a case that the third sub-target region is subjected to the force, both the third unit and the fourth unit deform and output the third sub-pressure signal together.

Further, since the third unit and the fourth unit are both arranged on the display screen 100, and the distance between the third unit and the fourth unit is close, when the third sub-target region is subjected to a force, a deformation occurs on the screen. Correspondingly, the third unit and the fourth unit are also subjected to the force, and the deformation of the deformation members in the third unit and the fourth unit may be related to the distance between the third unit and the fourth unit based on the force point of the third sub-target region.

In some embodiments, when a distance between a force point of the third sub-target region and the third unit is close, the first deformation member 312 of the third unit changes from the first shape to a seventh shape, the second deformation member 313 of the third unit changes from the second shape to an eighth shape, the first deformation member 312 of the fourth unit changes from the first shape to a ninth shape, and the second deformation member 313 of the fourth unit changes from the second shape to a tenth shape.

The deformation of the deformation member of the third unit is larger than that of the deformation member of the fourth unit.

Correspondingly, when a distance between a force point of the third sub-target region and the fourth unit is close, similar to the foregoing case, and details are not repeated herein for the brevity of the text.

The deformation of the deformation member of the fourth unit is larger than that of the deformation member of the third unit.

There is an overlapping region in the sensing range generated by two adjacent units. Because the distance between the third unit and the fourth unit is close, the overlapping region is large, and outputted two pressure signals are combined into one pressure signal, so that a pressure signal outputted finally is enhanced, which can improve sensitivity of the pressure sensing assembly.

In a possible implementation in this application, the electronic device may further include: a fingerprint module 400, and the fingerprint module 400 is arranged in the accommodating cavity.

In some embodiments, the fingerprint module 400 is an under-screen fingerprint module, and the fingerprint module 400 is generally arranged at the lower half screen of the display screen 100. Therefore, the fingerprint module 400 needs to be avoided when the pressure sensing assembly is set. As mentioned above, the second pressure sensing module 320 is arranged at the lower half screen of the display screen 100, so the second pressure sensing module 320 needs to avoid the fingerprint module 400.

Further, the fingerprint module 400 may be arranged at a same distance from two long sides of the display screen 100.

The second pressure sensing module 320 includes a fifth unit and a sixth unit arranged at intervals, and the fifth unit and the sixth unit each include a first deformation member 312, a second deformation member 313, and a supporting member 311. The first deformation member 312, the supporting member 311, and the second deformation member 313 are stacked in sequence in a direction perpendicular to the display screen 100. The fifth unit and the sixth unit are distributed in the width direction of the display screen 100.

That is, the second pressure sensing module 320 has a strip-shaped structure and is arranged in the width direction of the display screen 100. Since the fingerprint module 400 is arranged at the lower half screen of the display screen 100 and is located in a middle of the screen, the second pressure sensing module 320 is arranged in the width direction of the display screen 100, so that the fingerprint module 400 may be better avoided.

In a possible implementation of this application, a target region may include a fourth sub-target region and a fifth sub-target region. Correspondingly, a pressure signal may include a fourth sub-pressure signal and a fifth sub-pressure signal, where the fourth sub-target region corresponds to the fifth unit and the fifth sub-target region corresponds to the sixth unit.

In a case that both the fourth sub-target region and the fifth sub-target region are not subjected to the force, the first deformation member 312 is in the first shape, and the second deformation member 313 is in the second shape; in a case that the fourth sub-target region is subjected to the force and the fifth sub-target region is not subjected to the force, the fifth unit deforms and outputs the fourth sub-pressure signal; and in a case that the fifth sub-target region is subjected to the force and the fourth sub-target region is not subjected to the force, the sixth unit deforms and outputs the fifth sub-pressure signal.

In some embodiments, since both the fifth unit and the sixth unit are arranged on the display screen 100, when a sub-target region corresponding to one unit is subjected to a force, a deformation occurs on the screen, and the other unit is also subjected to a large or small force, and the force may be determined based on a position of the force. If the position of the force is close to the other unit, the force is larger, and if the position of the force is far away from the other unit, the force is smaller or even be ignored.

For example, when the fourth sub-target region is subjected to a force, and the force is large or the force point is close to the sixth unit, the first deformation member 312 of the fifth unit changes from the first deformation to an eleventh deformation, the second deformation member 313 of the fifth unit changes from the second deformation to a twelfth deformation, the first deformation member 312 of the sixth unit changes from the first deformation to a thirteenth deformation, and the second deformation member 313 of the sixth unit changes from the second deformation to a fourteenth deformation. In this case, the deformation members of the two units are both deformed, so that the sensing region also has an overlap, and the generated pressure signal is also a pressure signal combined by the pressure signals of the two units. Since the fifth unit is subjected to a great force, a pressure signal generated finally is mainly a pressure signal generated by the fifth unit.

The deformation of the deformation member of the fifth unit is larger than that of the deformation member of the sixth unit.

When the fourth sub-target region is subjected to a force, and the force is small or the force point is far away from the sixth unit, the force in the sixth unit may be ignored, and a pressure signal generated finally is a pressure signal generated by the fifth unit.

Correspondingly, the force on the fifth sub-target region is similar to that on the fourth sub-target region, and details are not repeated herein for the brevity of the text. The deformation of the deformation member of the sixth unit is larger than that of the deformation member of the fifth unit.

According to the deformation of the deformation members, the control module may determine a pressure signal outputted by the second pressure sensing module 320, and then control the electronic device through the pressure signal. When different positions of the display screen 100 are subjected to the force or a magnitude of the force is different, the pressure signals outputted by the second pressure sensing module 320 determined by the control module are different, so that various human-computer interaction modes may be implemented to satisfy user requirements.

As described above, the first deformation member 312 and the second deformation member 313 may adopt a Wheatstone bridge structure, that is, the first deformation member 312 is two resistors, the second deformation member 313 is two resistors, and the four resistors form the Wheatstone bridge structure, so that a measured deformation is more accurate. The supporting member 311 may be two rigid conductive members spaced apart. Therefore, the structure of the pressure sensing assembly may be that an upper part of the two rigid conductive members spaced apart is connected through the two resistors, and a lower part is connected through the two resistors. The figure may be shown in an upper half or a lower half of FIG. 3 and FIG. 5.

The resistor may be replaced by another deformation member, and this is not specifically described in the embodiments.

It should be noted that, the term "include", "comprise" or any other variation thereof in this specification is intended to cover a non-exclusive inclusion, which specifies the presence of stated processes, methods, objects, or apparatuses, but does not preclude the presence or addition of one or more other processes, methods, objects, or apparatuses. Without more limitations, elements defined by the sentence "including one" does not exclude that there are still other same elements in the processes, methods, objects, or apparatuses. In addition, it should be pointed out that the scope of the methods and apparatuses in the embodiments of this application is not limited to performing the functions in the order shown or discussed, but also can include performing the functions in basically the same way or in the opposite order according to the functions involved, for example, the described methods can be performed in a different order from the described ones, and various steps can also be added, omitted, or combined. In addition, features described with reference to some examples may be combined in other examples.

Through the descriptions of the foregoing implementations, a person skilled in the art may clearly understand that the method according to the foregoing embodiments may be implemented by means of software and a necessary general hardware platform, or, may be implemented by hardware. In some embodiments, the technical solutions in this application essentially or the part contributing to the reflected technologies may be implemented in the form of a software product. The computer software product is stored in a storage medium (for example, a ROM/RAM, a magnetic disk, or an optical disc), and includes several instructions for instructing a terminal (which may be a mobile phone, a computer, a server, an air conditioner, a network device, or the like) to perform the method described in the embodiments of this application.

The embodiments of this application are described above with reference to the accompanying drawings, but this application is not limited to the foregoing embodiments, which are merely illustrative rather than limited. Under the inspiration of this application, a person of ordinary skill in the art may make various variations without departing from the scope of this application and the protection of the claims, and such variations shall fall within the protection of this application.

What is claimed is:

1. An electronic device, comprising:
   a housing;
   a display screen, wherein the display screen is arranged on the housing and enclosed with the housing to form an accommodating cavity, and the display screen has a target region;
   a functional module, in a direction perpendicular to the display screen, wherein a projection of the functional module is located outside a projection of a pressure sensing assembly; and
   the pressure sensing assembly, wherein:
   the pressure sensing assembly is arranged in the display screen and located in the accommodating cavity,
   the pressure sensing assembly corresponds to the target region,
   the pressure sensing assembly comprises a first deformation member, a second deformation member, and a supporting member, and
   the first deformation member, the supporting member, and the second deformation member are stacked in sequence in the direction perpendicular to the display screen,
   wherein:
   when the target region is not subject to a force, the first deformation member is in a first shape, and the second deformation member is in a second shape; or
   when the target region is subject to a force, the pressure sensing assembly deforms and outputs a pressure signal,
   wherein the pressure sensing assembly further comprises a first pressure sensing module and a second pressure sensing module,
   wherein at least a part of the first pressure sensing module and the functional module are distributed in a width direction of the display screen, and the second pressure sensing module and the first pressure sensing module are distributed in a length direction of the display screen, wherein the first pressure sensing module and the second pressure sensing module output respective pressure signals in response to a force, wherein:

the first pressure sensing module comprises a first unit and a second unit that are spaced apart;

the first unit and the second unit each comprise the first deformation member, the second deformation member, and the supporting member, wherein the first deformation member, the supporting member, and the second deformation member are stacked in sequence in the direction perpendicular to the display screen; and the first unit and the second unit are distributed in the length direction of the display screen, wherein:

the target region comprises a first sub-target region and a second sub-target region, and the pressure signal comprises a first sub-pressure signal and a second sub-pressure signal;

the first sub-target region corresponds to the first unit, and the second sub-target region corresponds to the second unit;

when both the first sub-target region and the second sub-target region are not subject to a force, the first deformation member is in the first shape, and the second deformation member is in the second shape;

when the first sub-target region is subject to a force, and the second sub-target region is not subject to a force, the first unit deforms and outputs the first sub-pressure signal; and when the second sub-target region is subject to a force, and the first sub-target region is not subject to a force, the second unit deforms and outputs the second sub-pressure signal.

2. The electronic device according to claim 1, wherein distances between the first pressure sensing module and two long sides of the display screen are the same.

3. The electronic device according to claim 1, wherein:

the first pressure sensing module comprises a third unit and a fourth unit connected to each other;

the third unit and the fourth unit each comprise the first deformation member, the second deformation member, and the supporting member, wherein the first deformation member, the supporting member, and the second deformation member are stacked in sequence in the direction perpendicular to the display screen; and the third unit and the fourth unit are distributed in the width direction of the display screen.

4. The electronic device according to claim 1, further comprising a fingerprint module arranged in the accommodating cavity.

5. The electronic device according to claim 4, wherein:

distances between the fingerprint module and two long sides of the display screen are the same; and a fifth unit and a sixth unit each comprise the first deformation member, the second deformation member, and the supporting member, wherein the first deformation member, the supporting member, and the second deformation member are stacked in sequence in the direction perpendicular to the display screen.

* * * * *